(12) United States Patent
Takeuchi et al.

(10) Patent No.: US 10,870,913 B2
(45) Date of Patent: Dec. 22, 2020

(54) PROCESSING DEVICE, SPUTTERING DEVICE, AND COLLIMATOR

(71) Applicant: Kabushiki Kaisha Toshiba, Minato-ku (JP)

(72) Inventors: Masakatsu Takeuchi, Obu (JP); Shiguma Kato, Yokohama (JP); Yasuhiro Aoyama, Yokkaichi (JP); Takahiro Terada, Yokohama (JP); Yoshinori Tokuda, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 155 days.

(21) Appl. No.: 15/753,831

(22) PCT Filed: Dec. 19, 2016

(86) PCT No.: PCT/JP2016/087824
§ 371 (c)(1),
(2) Date: Feb. 20, 2018

(87) PCT Pub. No.: WO2017/158980
PCT Pub. Date: Sep. 21, 2017

(65) Prior Publication Data
US 2018/0237903 A1    Aug. 23, 2018

(30) Foreign Application Priority Data

Mar. 14, 2016  (JP) ................................. 2016-050218

(51) Int. Cl.
*H01J 37/34*      (2006.01)
*C23C 14/54*      (2006.01)
(Continued)

(52) U.S. Cl.
CPC .............. *C23C 14/54* (2013.01); *C23C 14/34* (2013.01); *C23C 14/35* (2013.01); *H01J 37/3447* (2013.01); *H01L 21/285* (2013.01)

(58) Field of Classification Search
CPC ......... C23C 14/34; C23C 14/35; C23C 14/54; H01J 37/3447; H01L 21/285
(Continued)

(56) References Cited

U.S. PATENT DOCUMENTS 4,901,667 A * 2/1990 Suzuki .................. C23C 16/452
                                                         118/715
5,340,460 A * 8/1994 Kobayashi ............ C23C 14/564
                                                         204/298.09
(Continued)

FOREIGN PATENT DOCUMENTS

JP     10-303132 A      11/1998
JP    2000-216092 A      8/2000
(Continued)

OTHER PUBLICATIONS

Machine Translation JP 2001-234337. (Year: 2001).*
Internatianal Search Report dated Feb. 7, 2017, in PCT/JP2016/087624 filed Dec. 19, 2016.

*Primary Examiner* — Rodney G McDonald
(74) *Attorney, Agent, or Firm* — Oblon, McClelland, Maier & Neustadt, L.L.P.

(57) ABSTRACT

A processing device according to one embodiment includes an object placement unit, a source placement unit, a collimator, and a temperature adjusting unit. The object placement unit is configured to have an object arranged. The object placement unit is configured to have an object placed thereon. The source placement unit is arranged apart from the object placement unit and configured to have a particle source placed thereon, the particle source being capable of ejecting a particle toward the object. The collimator config- (Continued)

ured to be arranged between the object placement unit and the source placement unit, includes walls, and is provided with through holes formed by the walls and extending a direction from the object placement unit to the source placement unit. The temperature adjusting unit is configured to adjust a temperature of the collimator.

15 Claims, 8 Drawing Sheets

(51) Int. Cl.
    *C23C 14/35*     (2006.01)
    *H01L 21/285*     (2006.01)
    *C23C 14/34*     (2006.01)

(58) Field of Classification Search
    USPC .......................... 204/192.12, 298.09, 298.11
    See application file for complete search history.

(56) References Cited

U.S. PATENT DOCUMENTS

| | | | |
|---|---|---|---|
| 6,036,821 A | | 3/2000 | Warren |
| 6,113,754 A | * | 9/2000 | Oh ..................... C23C 14/3407 |
| | | | 204/192.12 |
| 2015/0354054 A1 | | 12/2015 | Fruchterman et al. |

FOREIGN PATENT DOCUMENTS

| | | | |
|---|---|---|---|
| JP | 2001-234337 | * | 8/2001 |
| TW | 201109464 A1 | | 3/2011 |

\* cited by examiner

PROCESSING DEVICE, SPUTTERING DEVICE, AND COLLIMATOR

CROSS-REFERENCE TO RELATED APPLICATIONS

This application is national stage application of International Application No. PCT/JP2016/087824, filed Dec. 19, 2016, which designates the United States, incorporated herein by reference, and which claims the benefit of priority from Japanese Patent Application No. 2016-050218, filed Mar. 14, 2016, the entire contents of which are incorporated herein by reference.

FIELD

Embodiment described herein relates generally to a processing device, a sputtering device, and a collimator.

BACKGROUND

For example, a sputtering device for forming a metal film on a semiconductor wafer includes a collimator for adjusting the direction of metal particles to be formed into a film. The collimator includes walls that form a number of through holes, and allows particles flying in a direction substantially perpendicular to an object to be processed such as a semiconductor wafer to pass therethrough and blocks obliquely flying particles.

Various conditions are involved in processing such as sputtering, and the result of the processing is changed as the conditions are changed.

DETAILED DESCRIPTION

In general, according to one embodiment, a processing device according to one embodiment includes an object placement unit, a source placement unit, a collimator, and a temperature adjusting unit. The object placement unit is configured to have an object placed thereon. The source placement unit is arranged apart from the object placement unit and configured to have a particle source placed thereon, the particle source being capable of ejecting a particle toward the object. The collimator is configured to be arranged between the object placement unit and the source placement unit, includes a plurality of walls, and is provided with a plurality of through holes formed by the plurality of walls and extending a direction from the object placement unit to the source placement unit. The temperature adjusting unit is configured to adjust a temperature of the collimator.

Hereinafter, a first embodiment will be described with reference to FIGS. 1 to 5. In this specification, basically, the vertical upward direction is defined as an upward direction, and the vertical downward direction is defined as a downward direction. Further, in this specification, a plurality of expressions is sometimes written about configuration elements of the embodiments and the description of the elements. Other expressions that are not written may be made for the configuration elements and the description about which the plurality of expressions has been made. Further, other expressions that are not written may be made for configuration elements and description about which a plurality of expressions is not made.

Figure 1:
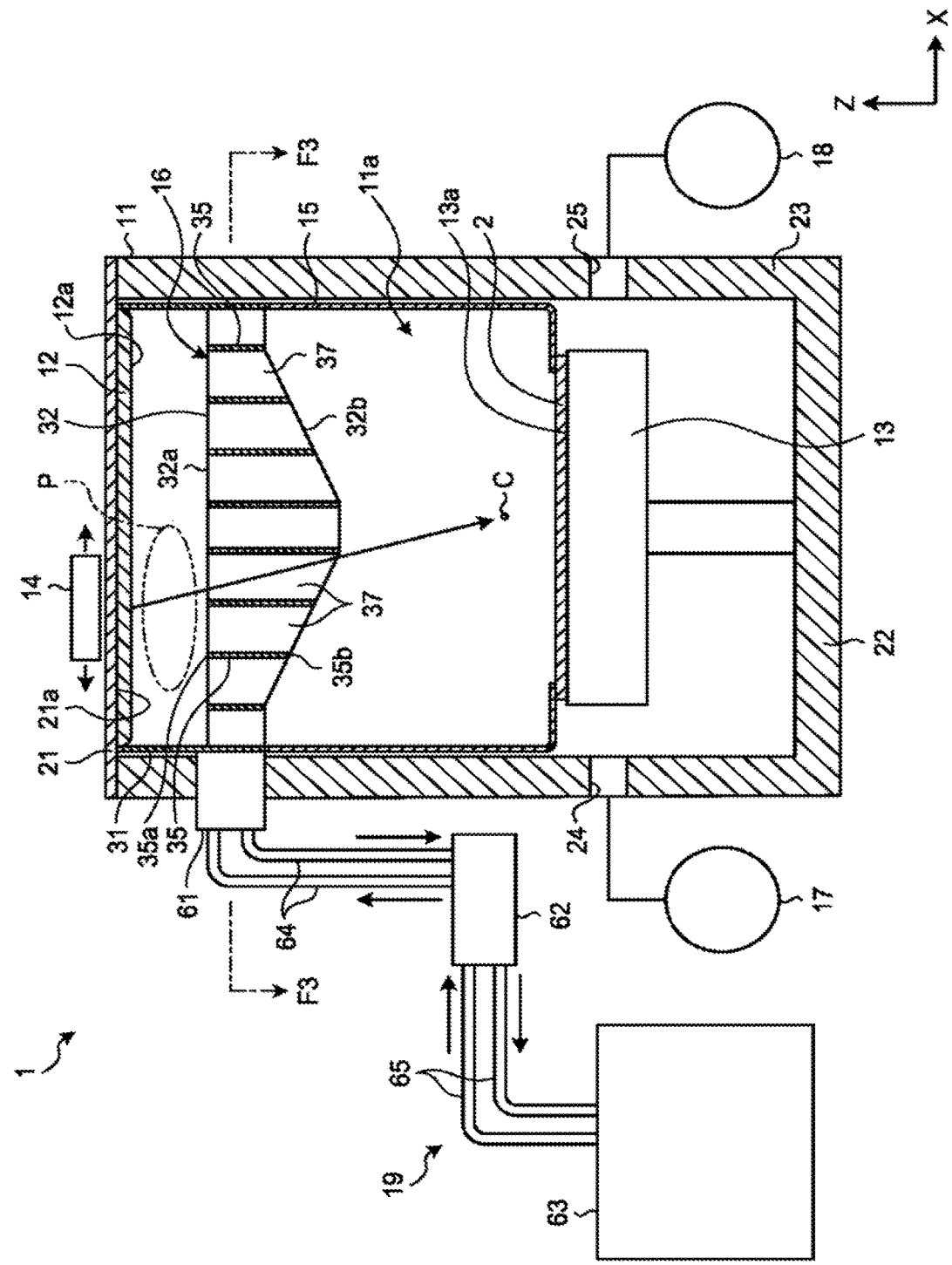
FIG. 1 is a cross-sectional view schematically illustrating a sputtering device according to a first embodiment.

FIG. 1 is a cross-sectional view schematically illustrating a sputtering device 1 according to the first embodiment. The sputtering device 1 is an example of a processing device, and may be referred to as a semiconductor manufacturing device, a manufacturing device, a processing device, or a device, for example.

The sputtering device 1 is a device for performing magnetron sputtering, for example. The sputtering device 1 forms a film, with metal particles on a surface of a semiconductor wafer 2, for example. The semiconductor wafer 2 is an example of an object and may also be referred to as a subject, for example. The sputtering device 1 may form a film on another subject, for example.

The sputtering device 1 includes a chamber 11, a target 12, a stage 13, a magnet 14, a shielding member 15, a collimator 16, a pump 17, a tank 18, and a temperature adjusting device 19. The chamber 11 is an example of a container. The target 12 is an example of a particle generation source. The collimator 16 may also be referred to as a shielding part, a flow rectifying part, or a direction adjusting part, for example. The pump 17 can also be referred to as, for example, a pressure adjusting unit, a gas removing part, or a suction unit. The temperature adjusting device 19 is an example of a temperature adjusting unit.

As illustrated in the drawings, in the present specification, an X axis, a Y axis, and a Z axis are defined. The X axis, the Y axis, and the Z axis are orthogonal to one another. The X axis is along the width of the chamber 11. The Y axis is along the depth (length) of the chamber 11. The Z axis is along the height of the chamber 11. The following description will be given on tee assumption that the Z axis is along a vertical direction. Note that the Z axis of the sputtering device 1 may obliquely intersect with the vertical direction.

The chamber 11 is formed in a sealable box shape. The chamber 11 includes an upper wall 21, a bottom wall 22, a side wall 23, a discharge port 24, and an introduction port 25. The upper wall 21 may also be referred to as, for example, backing plate, mounting portion, or a holding portion.

The upper wall 21 and the bottom wall 22 are arranged to face each other in the direction along the Z axis (vertical direction). The upper wall 21 is positioned above the bottom wall 22 via a predetermined interval. The side wall 23 is formed in a cylindrical shape extending in the direction along the Z axis, and connects the upper wall 21 and the bottom wall 22.

A processing chamber 11a is provided inside the chamber 11. The processing chamber 11a may also be referred to as an interior of a container. Inner walls of the upper wall 21, the bottom wall 22, and the side wall 23 form the processing chamber 11a. The processing chamber 11a can be airtightly closed. In other words, the processing chamber 11a can be hermetically sealed. The airtightly closed state is a state in which gas movement dons not occur between an inside and an outside of the processing chamber 11a. The discharge port 24 and the introduction port 25 may open in the processing chamber 11a.

The target 12, the stage 13, the shielding member 15, and the collimator 16 are arranged in the processing chamber 11a. In other words, the target 12, the stage 13, the shielding member 15, and the collimator 16 are housed in the chamber 11. The target 12, the stage 13, the shielding member 15, and the collimator 16 may be partially positioned outside the processing chamber 11a.

The discharge port 24 opens into the processing chamber 11a and is connected to the pump 17. The pump 17 is, for example, a dry pump. As the pump 17 sucks a gas in the processing chamber 11a through the discharge port 24, the atmospheric pressure in the processing chamber 11a can be decreased. The pump 17 may evacuate the processing chamber 11a.

The introduction port 25 opens into the processing chamber 11a and is connected to the tank 18. The tank 18 stores an inert gas such as an argon gas. The argon gas can be introduced from the tank 18 through the introduction port 25 into the processing chamber 11a. The tank 18 includes a valve capable of stopping the introduction of the argon gas.

The target 12 is, for example, a disc-shaped metal plate used as a particle generation source. Note that the target 12 may be formed in another shape. In the present embodiment, the target 12 is made of, for example, copper. The target 12 may be made of other materials.

The target 12 is attached to an attaching surface 21a of the upper wall 21 of the chamber 11. The upper wall 21 that is a backing plate is used as a coolant and an electrode of the target 12. The chamber 11 may include a backing plate as a separate part from the upper wall 21.

The attaching surface 21a of the upper wall 21 is an inner surface of the upper wall 21, the inner surface facing downward and being formed to be approximately flat. The target 12 is arranged on such an attaching surface 21a. The upper wall 21 is an example of a source placement unit. The source placement unit is not limited to an independent member or part, and may be a specific position on a certain member or part.

The target 12 includes a lower surface 12a. The lower surface 12a is an approximately flat surface facing downward. When a voltage is applied to the target 12, the argon gas introduced into the chamber 11 is ionized and plasma P is generated. FIG. 1 illustrates the plasma P by the two-dot chain line.

The magnet 14 is positioned outside the processing chamber 11a. The magnet 14 is movable along the upper wall 21 and the target 12. The plasma P is generated near the magnet 14. Therefore, the target 12 is positioned between the magnet 14 and the plasma P.

When the argon ions of the plasma P collide with the target 12, particles C of a film forming material that configures the target 12 fly from the lower surface 12a of the target 12. In other words, the target 12 can emit the particles C. In the present embodiment, the particles C contain copper ions, copper atoms, and copper molecules.

Directions into which the particles C fly from the lower surface 12a of the target 12 are distributed according to the cosine law (Lambert's cosine law). That is, the particles C that fly from a certain point on the lower surface 12a fly in a normal direction (vertical direction) of the lower surface 12a the most. The number of particles flying in a direction tilted with respect to (a direction obliquely intersecting with) the normal direction at an angle θ is approximately proportional to the cosine (cos θ) of the number of particles flying in the normal direction.

The particle C is an example of a particle in the present embodiment, and is a fine particle of the film forming material that configures the target 12. The particles may be various particles that snake up a substance or energy rays, such as molecules, atoms, ions, nuclei, electrons, elementary particles, vapor (vaporized substance), and electromagnetic waves (photons).

The stage 13 is arranged on the bottom wall 22 of the chamber 11. The stage 13 is arranged away from the upper wall 21 and the target 12 in the direction along the Z axis. The stage 13 includes a placing surface 13a. The placing surface 13a of the stage 13 supports a semiconductor wafer 2. The semiconductor wafer 2 is formed in, for example, a disk shape. Note that the semiconductor wafer 2 may be formed in other shapes.

The placing surface 13a of the stage 13 is a substantially flat surface facing upward. The placing surface 13a is arranged away from the attaching surface 21a of the upper wall 21 in the direction along the Z axis and faces the attaching surface 21a. The semiconductor wafer 2 is arranged on such a placing surface 13a. The stage 13 is an example of an object placement unit. The object placement unit is not limited to an independent member or part, and say be a specific position on a certain member or part.

The stage 13 is movable in the direction along the Z axis, that is, in the vertical direction. The stage 13 includes a heater and is capable of warming the semiconductor wafer 2 arranged on the placing surface 13a. Further, the stage 13 is also used as an electrode.

The shielding member 15 is formed in an approximately cylindrical shape. The shielding member 15 covers a part of the side wall 23 and a gap between the side wall 23 and the semiconductor wafer 2. The shielding member 15 may hold the semiconductor wafer 2. The shielding member 15 suppresses adhesion of the particles C ejected from the target 12 to the bottom wall 22 and the side wall 23.

The collimator 16 is arranged between the attaching surface 21a of the upper wall 21 and the placing surface 13a of the stage 13 in the direction along the Z axis. According to another expression, the collimator 16 is arranged between the target 12 and the semiconductor wafer 2 in the direction along the Z axis (vertical direction). The direction along the Z axis and the vertical direction are a direction from the attaching surface 21a of the upper wall 21 to the placing surface 13a of the stage 13. The collimator 16 is attached to the side wall 23 of the chamber 11, for example. The collimator 16 may be supported by the shielding member 15.

In the direction along the Z axis, the distance between the collimator 16 and the attaching surface 21a of the upper wall 21 is shorter than the distance between the collimator 16 and the placing surface 13a of the stage 13. In other words, the collimator 16 is closer to the attaching surface 21a of the upper wall 21 than to the placing surface 13a of the stage 13. The arrangement of the collimator 16 is not limited thereto.

Figure 2:
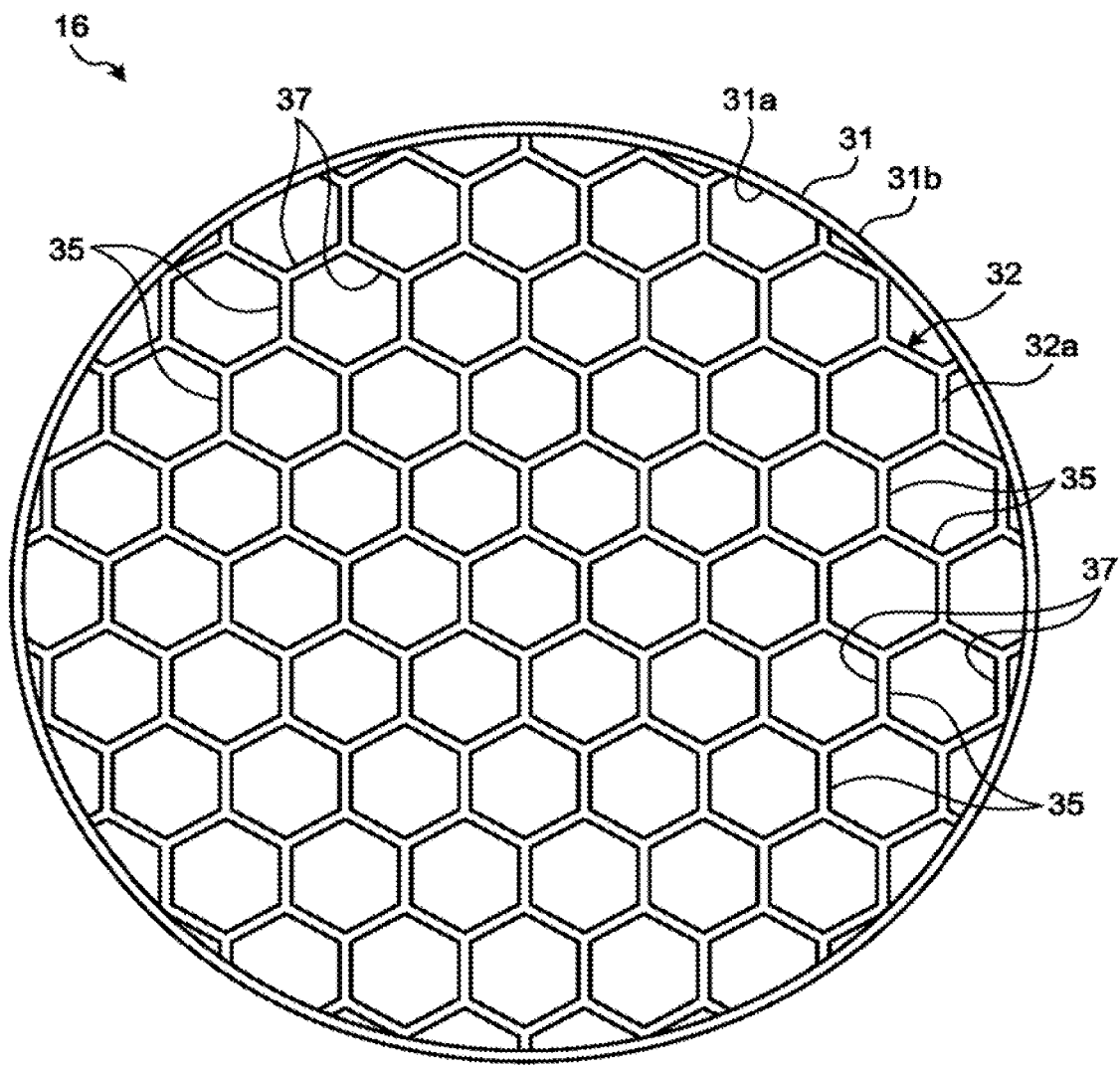
FIG. 2 is a plan view illustrating a collimator of the first embodiment.
Figure 2:
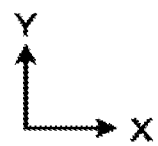

FIG. 2 is a plan view illustrating the collimator 16 of the first embodiment. As illustrated in FIG. 2, the collimator 16 includes a frame 31 and a flow rectifying portion 32. The frame 31 may also be referred to as, for example, an outer edge portion, a holding portion, a support portion, or a wall.

The frame 31 is a wall formed in a cylindrical shape extending in the direction along the Z axis. The frame 31 is not limited thereto, and may be formed in another shape such as a rectangle. The frame 31 includes an inner peripheral surface 31a and an outer peripheral surface 31b.

The inner peripheral surface 31a of the frame 31 is a curved surface that faces a radial direction of the cylindrical frame 31 and faces a central axis of the cylindrical frame 31. The outer peripheral surface 31b is positioned on an opposite side of the inner peripheral surface 31a. In an X-Y plane, the area of a portion surrounded by the outer peripheral surface 31b of the frame 31 is larger than the sectional area of the semiconductor wafer 2.

As illustrated in FIG. 1, the frame 31 covers a part of the side wall 23. The side wall 23 is covered with the shielding member 15 and the frame 31 of the collimator 16 between the upper wall 21 and the stage 13 in the direction along the Z axis. The frame 31 prevents adhesion of the particles C ejected from the target 12 to the side wall 23.

As illustrated in FIG. 2, the flow rectifying portion 32 is provided inside the cylindrical frame 31 on the X-Y plane. The flow rectifying portion 32 is connected to the inner peripheral surface 31a of the frame 31. The frame 31 and the flow rectifying portion 32 are integrally formed. The flow rectifying portion 32 may be a separate component from the frame 31.

As illustrated in FIG. 1, the flow rectifying portion 32 is separated from the upper wall 21 and is separated from the stage 13 in the direction along the Z axis. The flow rectifying portion 32 includes a plurality of walls 35. The wall 35 may also be referred to as, for example, a plate or a shielding portion.

The flow rectifying portion 32 forms a plurality of through holes 37 by the plurality of walls 35. The plurality of through holes 37 is hexagonal holes extending in the direction (vertical directions along the Z axis. In other words, the plurality of walls 35 forms an assembly of a plurality of hexagonal cylinders (honeycomb structure) having the through holes 37 formed therein. The through hole 37 extending in the direction along the Z axis can allow an object such as the particles C moving in the direction along the Z axis to pass therethrough. Note that the through hole 37 may be formed in another shape.

The flow rectifying portion 32 includes an upper end portion 32a and a lower end portion 32b. The upper end portion 32a is one end portion of the flow rectifying portion 32 in the direction along the Z axis and faces the target 12 and the attaching surface 21a of the upper wall 21. The lower end portion 32b is the other end portion of the flow rectifying portion 32 in the direction along the Z axis and faces the semiconductor wafer 2 supported by the stage 13 and the placing surface 13a of the stage 13.

The through hole 37 is provided from the upper end portion 32a to the lower end portion 32b of the flow rectifying portion 32. That is, the through hole 37 is as hole that opens toward the target 12 an opens toward the semiconductor wafer 2 supported by the stage 13.

Each of the plurality of walls 35 is a substantially rectangular (quadrangular) plate extending in the direction along the Z axis. The wall 35 may extend in a direction obliquely intersecting with the direction along the Z axis, for example. The wall 35 includes an upper end portion 35a and a lower end portion 35b.

The upper end portion 35a of the wall 35 is one end portion in the direction along the Z axis of the wall 35 and faces the target 12 and the attaching surface 21a of the upper wall 21. The upper end portions 35a of the plurality of walls 35 form the upper end portion 32a of the flow rectifying portion 32.

The upper end portion 32a of the flow rectifying portion 32 is formed to be substantially flat. The upper end portion 32a may be recessed in a curved manner with respect to the target 12 and the attaching surface 21a of the upper wall 21, for example. In other words, the upper end portion 32a may be curved away from the target 12 and the attaching surface 21a of the upper wall 21.

The lower end portion 35b of the wall 35 is the other end portion of the wall 35 in the direction along the Z axis and faces the semiconductor wafer 2 supported by the stage 13 and the placing surface 13a of the stage 13. The lower end portion 35b of the plurality of walls 35 forms the lower end portion 32b of the flow rectifying portion 32.

The lower end portion 32b of the flow rectifying portion 32 protrudes toward the semiconductor wafer 2 supported by the stage 13 and the placing surface 13a of the stage 13. In other words, the lower end portion 32b of the flow rectifying portion 32 approaches the stage 13 as the lower cud portion 32b is away from the frame 31.

The upper end portion 32a and the lower end portion 32b of the flow rectifying portion 32 have different shapes from each other. Therefore, the flow rectifying portion 32 includes the plurality of walls 35 having different lengths in the vertical direction. Note that, in the direction along the Z axis, the lengths of the plurality of walls 35 say be the same.

The collimator 16 is made of a metal seen as aluminum or copper, for example. The collimator 16 may be made of another material. The material of the frame 31 and the material of the flow rectifying portion 32 may be different.

Figure 3:
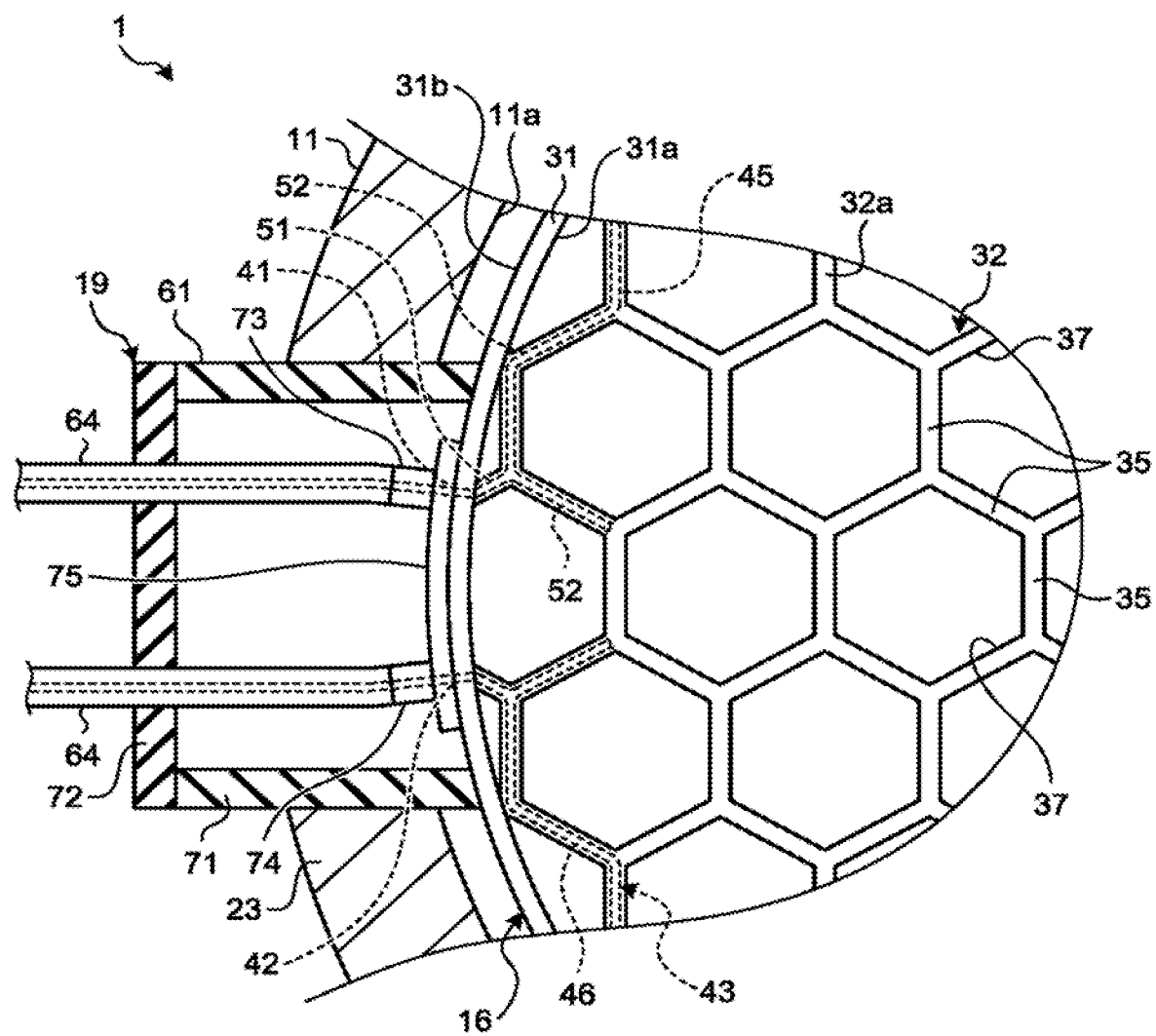
FIG. 3 is a cross-sectional view illustrating a part of the sputtering device of the first embodiment along the line F3-F3 of FIG. 1.

FIG. 3 is a cross-sectional view illustrating a part of the sputtering device 1 of the first embodiment along the line F3-F3 of FIG. 1. As illustrated in FIG. 3, the collimator 16 is provided with a first opening 41, a second opening 42, and a first flow path 43. Each of the first and second openings 41 and 42 may also be referred to as, for example, a connecting portion or an end portion. The first flow path 43 may also be referred to as, for example, a pipe portion or piping.

The first opening 41 and the second opening 42 are provided in the outer peripheral surface 31b of the frame 31. The first opening 41 and the second opening 42 are arranged at different positions from one another in the X-Y plane. However, the first opening 41 and the second opening 42 may be arranged at approximately the same position. The first opening 41 and the second opening 42 are arranged at different positions from each other in the direction along the Z axis. However, the first opening 41 and the second opening 42 may be arranged at approximately the same position.

The first flow path 43 is a hole that passes through insides of the plurality of walls 35. The first flow path 43 connects the first opening 41 and the second opening 42. In other words, the first opening 41 is one end portion of the first flow path 43, and the second opening 42 is the other end portion of the first flow path 43.

The first flow path 43 is provided inside all the walls 35. In other words, the first flow path 43 is provided inside the plurality of walls 35 to pass through all the walls 35. The flow rectifying portion 32 may include a wall 35 in which the first flow path 43 is not provided. Further, the first flow path 43 may be provided inside the frame 31. In FIG. 3, a part of the first flow path 43 is omitted. That is, the first flow path 43 is also provided inside the wall 35 where the first flow path 43 is not illustrated.

Figure 4:
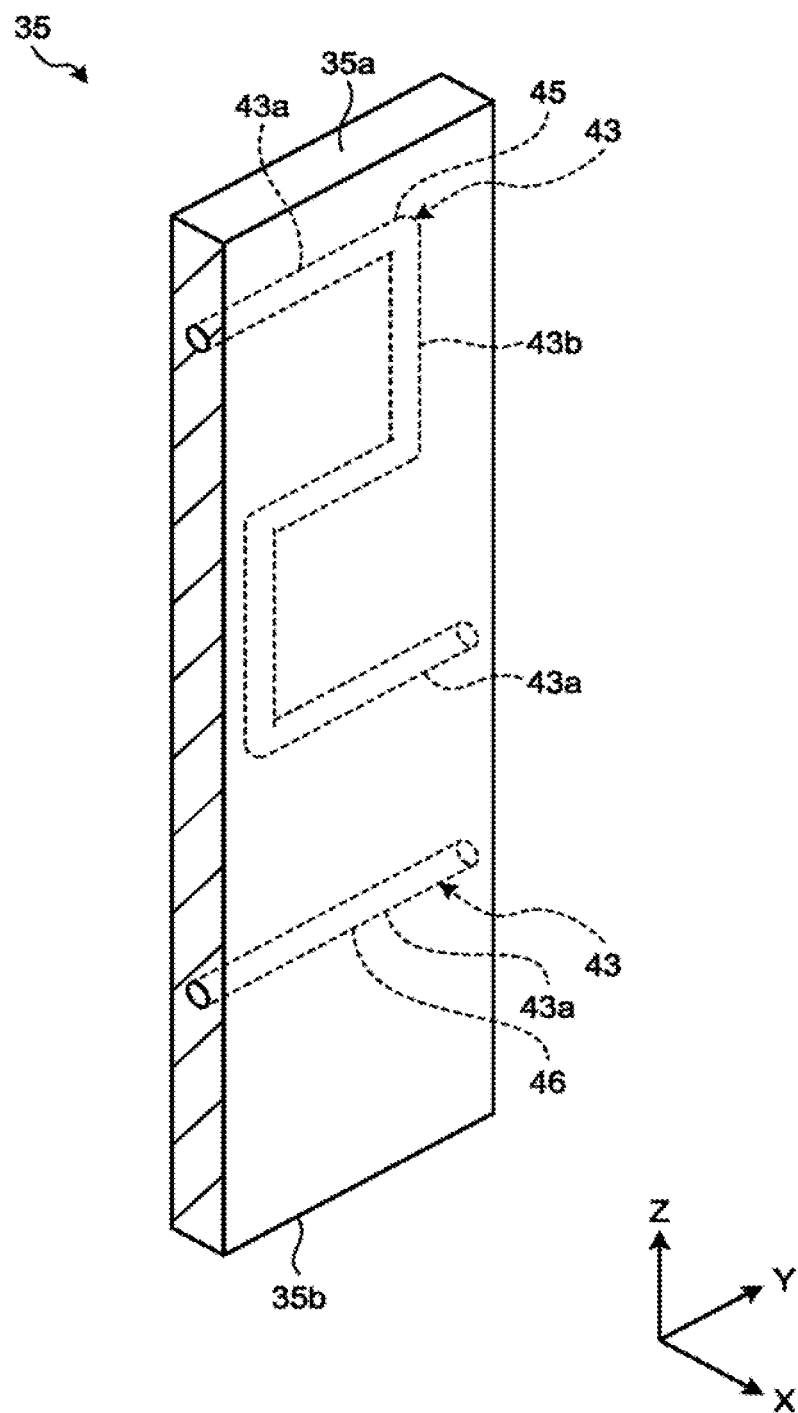
FIG. 4 is a perspective view schematically illustrating one wall of the first embodiment.

FIG. 4 is a perspective view schematically illustrating one wall 35 of the first embodiment. As illustrated in FIG. 4, the first flow path 43 may meander inside the one wall 35 or may linearly extend. In other words, the first flow path 43 may include a portion 43a linearly extending in a direction from the one wall 35 to another wall 35 (a direction along the Y axis in FIG. 4) and a linear or curved portion 45b extending in a direction intersecting with the direction from one wall 35 to another wall 35.

The first flow path 43 includes a supply portion 45 and a return portion 46. The supply portion 45 is a portion closer to the first opening 41 than to the second opening 42 in the path of the first flow path 43. The return portion 46 is a portion closer to the second opening 42 than to the first opening 41 in the path of the first flow path 43. As illustrated in FIG. 4, the supply portion 45 and the return portion 46 may be provided inside the one wall 35.

In a case where the wall 35 is divided into two parts in the direction along the Z axis, the density of the first flow path 43 in a part (upper half) close to the upper end portion 35a of the wall 35 is higher than the density of the first flow path 43 in a part (lower half) close to the lower end portion 35b of the wall 35. The density here is a volume of the first flow path 43 per volume of the wall 35. That is, a larger volume of the first flow path 43 is arranged near the upper end portion 35a of the wall 35. The arrangement of the first flow path 43 is not limited thereto.

As illustrated in FIG. 3, the first flow path 43 is branched inside the flow rectifying portion 33. In other words, the first flow path 43 includes a first portion 51 and a plurality of second portions 52. The first portion 51 is closer to the first opening 41 than the second portion 52 in the path of the first flow path 43. The plurality of second portions 52 is connected to the first portion 51. The second portion 52 is closer to the second opening 42 than the first portion 51 in the path of the first flow path 43. In FIG. 3, a part of one second portion 52 is omitted. Note that the first flow path 43 may be provided as a unicursal path without being branched.

In the path of the first flow path 43, the first flow path 45 is branched on the way from the first opening 41 to the second opening 42. The branched first flow paths 43 are pot together on the way from the first opening 41 toward the second opening 42.

As illustrated in FIG. 1, the temperature adjusting device 19 includes a first connecting device 61, a first freezing device 62, a compressor 63, two first pipes 64, and two second pipes 65. The temperature adjusting device 13 is a so-called freezing mechanism. The temperature adjusting device 19 may be another device for adjusting the temperature of an object.

The first connecting device 61 is provided in the chamber 11. As illustrated in FIG. 3, the first connecting device 61 includes a cover 71, a lid 72, a first connecting portion 73, a second connecting portion 74, and a fixing portion 75.

The cover 71 is provided to the side wall 23. The cover 71 connects an inside of the chamber 11 and an outside of the chamber 11. The lid 72 is attached to the cover 71, thereby to air tightly close the processing chamber 11a. The two first pipes 64 penetrate the lid 72.

The first connecting portion 73 is connected to one end portion of one of the first pipes 64. The second connecting portion 74 is connected to one end portion of the other of the first pipes 64. As illustrated in FIG. 1, the other end portions of the two first pipes 64 are connected to the first freezing device 62.

As illustrated in FIG. 3, the fixing portion 75 is connected to the first connecting portion 73 and the second connecting portion 74. The fixing portion 75 is attached to the outer peripheral surface 31b of the frame 31 of the collimator 16. When the fixing portion 75 is attached to the frame 31, the first connecting portion 73 is connected to the first opening 41, and the second connecting portion 74 is connected to the second opening 42.

The first connecting portion 73 and one of the first pipes 64 connect the first opening 41 and the first freezing device 62. The second connecting portion 74 and the other of the first pipes 64 connect the second opening 42 and the first freezing device 62.

Each of the cover 71, the lid 72, the first connecting portion 73, the second connecting portion 74, and the fixing portion 75 has insulating properties. For example, each of the cover 71, the lid 72, the first connecting portion 73, the second connecting portion 74, and the fixing portion 75 is made of an insulating material such as a synthetic resin or a ceramic. Note that a part of the first connecting device 61 may have conductivity.

As described above, the first connecting device 61 connects the first and second openings 41 and 42 and the first freezing device 62 via the two first pipes 64. The specific configuration of the first connecting device 61 is not limited to the above-described configuration.

The first freezing device 62 illustrated in FIG. 1 sends a heat medium compressed and cooled by a cylinder to cane of the first pipes 64. Further, the first freezing device 62 compresses and cools the heat medium, returned from the other of the first pipes 64 again by the cylinder. As described above, one of the first pipes 64 is a supply-side pipe. The other of the first pipes 64 is a return-side pipe.

The first freezing device 62 allows the heat medium to flow into the first opening 41 from one of the first pipes 64 and the first connecting portion 73. The heat medium flows into the first flow path 43 through the first opening 41.

The heat medium flows through the first flow path 43 through the first opening 41 toward the second opening 42. As the heat medium flows through the first flow path 43, the temperature of the wall 35 provided with the first flow path 45 is decreased. The temperature of the wall 35 in which no first flow path 43 is provided is also decreased due to heat conduction. In this manner, the temperature adjusting device 19 decreases the temperature of the collimator 16. In other words, the temperature adjusting device 19 is configured to change the temperature of the collimator 16 to adjust the temperature of the collimator 16.

The heat medium flows out through the second opening 42 to the second connecting portion 74. The heat medium passes through the second connecting portion 74 and the other of the first pipes 64 through the second opening 42, and is returned to the first freezing device 62. The first freezing device 62 cools again the heat medium flowing out through the second opening 42 and sends the heat medium to the first opening 41.

The heat medium in this embodiment is a helium gas. Helium has high thermal conductivity and can more efficiently cool the collimator 16. Further, the helium gas as a gas easily flows through the narrow first flow path 43. Note that the heat medium may be another substance.

The two second pipes 65 connect the first freezing device 62 and the compressor 63. One of the second pipes 65 is a supply (high pressure)-side pipe. The other of the second pipes 65 is a return (low pressure)-side pipe.

The sputtering device 1 described above performs magnetron sputtering, as follows, for example. A method of performing magnetron sputtering by the sputtering device 1 is not limited to the method described below.

First, the pump 17 sucks the gas in the processing chamber 11a through the discharge port 24. As a result, the air in the processing chamber 11a is removed, and the atmospheric pressure in the processing chamber 11a is reduced. However, air may remain in the processing chamber 11a.

Next, the temperature adjusting device 19 operates the first freezing device 62. The first freezing device 62 causes the compressed and cooled heat medium to flow into the first flow path 43 through the first opening 41. In other words, the first freezing device 62 causes the heat medium to flow into the collimator 16.

The first freezing device 62 causes the heat medium to flow into the first flow path 43 to decrease the temperature of the collimator 16. For example, the first freezing device 62 decreases the temperature of the plurality of walls 35 of the collimator 16 to several Kelvin. The temperature of the wall 35 is not limited thereto.

As the temperature of the collimator 16 is decreased, the air remaining in the processing chamber 11a is condensed on the surface of the wall 35. For example, helium, hydrogen, oxygen, and other substances are attached to the surface of the wall 35. In other words, the wall 35 absorbs the gas in the processing chamber 11a.

The surface of the wall 35 is formed in a so-called satin finish and has irregularities. With the configuration, the surface area of the wall 35 becomes larger, and the air is easily condensed on the surface of the wall 35. The surface of the wall 35 may be smooth, for example.

As described, above, the plurality of walls 55 of the collimator 16 function as a so-called cryopanel. The cryopanel is a cryogenic surface in a cryopump. The temperature adjusting device 19 causes the gas in the processing chamber 11a to be absorbed by the collimator 16 to make the processing chamber 11a vacuum.

Next, an argon gas is introduced into the processing chamber 11a from the tank 18 through the introduction port 25. When a voltage is applied to the target 12, the plasma P is generated near the magnetic field of the magnet 14. When ions sputter the lower surface 12a of the target 12, the particles C are ejected from the lower surface 12a of the target 12 toward the semiconductor wafer 2. While the target 12 emits the particles C, the temperature adjusting device 19 decreases the temperature of the collimator 16 or keeps the temperature to the cryogenic temperature.

The particles C ejected in the vertical direction pass through the through hole 37 of the collimator 16 and fly toward the semiconductor wafer 2 supported by the stage 13. Note that the particles C flying in the vertical direction sometimes adhere to the upper end portion 35a of the wall 35, for example.

On the other hand, there are also the particles C ejected in a direction, obliquely intersecting with the vertical direction (in an inclined direction). The particle C having an angle larger than a predetermined range, the angle being made by the inclined direction and the vertical direction, adheres to the wall 35. That is, the collimator 16 blocks the particles C having an angle that falls outside a predetermined range, the angle being made by the inclined direction and the vertical direction. The particles C flying in the inclined direction may adhere to the shielding member 15 or the frame 31 of the collimator 16.

The particles C having an angle that fails within a predetermined range, the angle being made by the inclined direction and the vertical direction, pass through the through hole 37 of the collimator 16 and fly toward the semiconductor wafer 2 supported by the stage 13. Note that the particles C having the angle that falls within a predetermined range, the angle being made by the inclined direction and the vertical direction, may also adhere to the wall 35.

Figure 5:
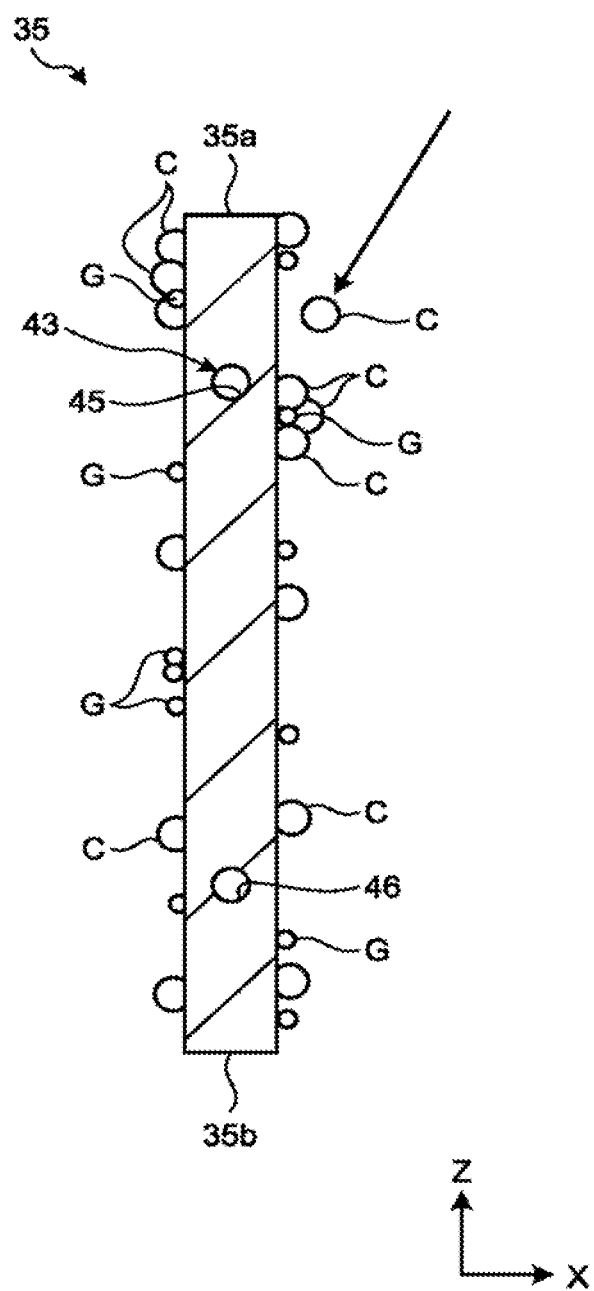
FIG. 5 is a cross-sectional view schematically illustrating one wall of the first embodiment.

FIG. 5 is a cross-sectional view schematically illustrating one wall 35 of the first embodiment. As illustrated in FIG. 5, the particles C and absorption gases G adhere to the surface of the wall 35. The absorption gas G is, for example, solid or liquid air absorbed on the surface of the wall 35.

When the absorption gas G covers the surface of the wall 35, there is a possibility that the performance of the wall 35 to absorb the absorption, gas G is deteriorated. However, in a state where the absorption gas G adheres to the wall 35, the particles C further adhere to the wall 35. The particles C are metal particles and nave high thermal conductivity.

As the heat medium flows through the first flow path 43, the temperature of the particles C adhering to the wall 55 is decreased. The particles C adhering to the wall 35 become a part of the surface of the wall 35 and absorb the gas in the processing chamber 11a. In this way, the surface of the wall 35 is newly formed by the particles C, and thus a decrease in the performance of the wall 35 to absorb the absorption gas G is suppressed.

The particles C that have passed through the through hole 33 of the collimator 16 adhere to and are deposited on the semiconductor wafer 2, whereby a film is formed on the semiconductor wafer 2. In other words, the semiconductor wafer 2 receives the particles C ejected by the target 12. The directions of the particles C that have passed through the through hole 37 are adjusted within a predetermined range with respect to the vertical direction. In this way, the directions of the particles C deposited on the semiconductor wafer 2 are controlled according to the shape of the collimator 16.

The magnet 14 is moved until the thickness of the film of the particles C formed on the semiconductor wafer 2 reaches a desired thickness. As the magnet 14 is moved, the plasma P is moved and the target 12 can be uniformly shaved.

When the sputtering device 1 described above is used a predetermined number of times, the absorption gas G is accumulated on the surface f the collimator 16. Therefore, the collimator 16 is placed at an ordinary temperature, and the regeneration to remove the absorption gas G is performed. However, as described above, since the surface of the wall 35 is newly formed by the particles C, the number of times of the regeneration is decreased, or the regeneration becomes unnecessary. The absorption gas G may be removed together with the particles C when, the particles C adhering to the collimator 16 is removed.

The collimator 16 of the present embodiment is laminated and shaped by, for example, a 3D printer. Therefore, the collimator 16 provided with the first flow path 43 can be easily manufactured. Note that the collimator 16 is not limited thereto, and may be manufactured by another method.

In the sputtering device 1 according to the first embodiment, the temperature adjusting device 19 is configured to change the temperature of the collimator 16 to adjust the temperature of the collimator 16. For example, the temperature adjusting device 19 keeps the temperature of the collimator 16 constant, thereby to suppress change of the amount and the direction of the particles C blocked by the collimator 16, due to temperature change of the collimator 16. Further, when the temperature of the collimator 16 is changed in a state where the particles C elected from the target 12 adhere to the collimator 16, the particles C adhering to the collimator 16 may be detached due to stress. The temperature adjusting device 19 keeps the temperature of the collimator 16 constant, thereby to suppress detachment of the particles C adhering to the collimator 16. Therefore, generation of dust of the particles C in the processing chamber 11a is suppressed.

The temperature adjusting device 19 decreases the temperature of the collimator 16. The collimator 16 is arranged in the processing chamber 11a that can be airtightly closed. When the temperature adjusting device 19 decreases the temperature of the collimator 16 to several Kelvin, the gas in the processing chamber 11a is absorbed on the surface of the collimator 16. With the absorption, the collimator 16 can further decrease the atmospheric pressure inside the processing chamber 11a. In other words, since the collimator 16 can be used like a cryopanel of a cryopump, the processing chamber 11a is evacuated without any other vacuum pump such as a turbo molecular pump or a cryopump, and an increase in the number of parts of the sputtering device 1 is suppressed.

The collimator 16 includes a plurality of walls 35 that forms a plurality of through holes 37. Therefore, the surface area of the collimator 16 is large. As such a collimator 16 is cooled, the gas in the processing chamber 11a is more quickly cooled and is more quickly absorbed by the collimator 16. In other words, when viewing the collimator 16 and the temperature adjusting device 19 to be a cryopump, the exhaust speed can be easily increased.

As described above, when the temperature of the collimator 16 is changed, the particles C adhering to the collimator 16 may be detached due to stress. However, the time until the particles C adhering to the collimator 16 are detached is inversely proportional to the temperature of the collimator 16. The temperature adjusting device 19 decreases the temperature of the collimator 16, thereby to suppress detachment of the particles C adhering to the collimator 16. Therefore, generation of dust of the particles C in the processing chamber 11a is suppressed.

Further, in a case where the sputtering device 1 performs magnetron sputtering, the plasma P is generated near the upper wall 21. The collimator 16 absorbs the gas in the processing chamber 11a between the stage 13 and the upper wall 21. With the absorption, taking in of impurities into the plasma P is suppressed. Therefore, impurities contained in the film of the particles C deposited on the semi conductor wafer 2 are reduced, and the specific resistance of the film of the particles C formed on the surface of the semiconductor wafer 2 is reduced.

The first flow path 43 passes through the insides of the plurality of walls 35 and the heat medium flows into the first flow path 43. The temperature adjusting device 13 cools the heat medium flowing out through the second opening 42 of the collimator 16 and causes the heat medium to flow into the first flow path 43 of the collimator 16 through the first opening 41. With the configuration, the heat medium decreases the temperature of the collimator 16, and the temperature adjusting device 19 can easily decrease the temperature of the collimator 16.

The first flow path 43 includes the first portion 51, and the plurality of second portions 52 connected to the first portion 51 and closer to the second opening 42 than the first portion 51 in the path of the first flow path 43. In other words, the first flow path 43 is branched inside the collimator 16. With the configuration, the collimator 16 having a large surface area can be more easily cooled to several Kelvin.

The first and second connecting portions 73 and 74 connected to the first and second openings 41 and 42 have insulating properties. The collimator 16 and the temperature adjusting device 19 are insulated from each other. With the insulation, an influence of the potential of the collimator 16 on the trajectory of the particles C ejected from the target 12 is suppressed.

The pump 17 sucks the gas in the processing chamber 11a. For example, the processing chamber 11a in a low pressure state by the pump 17 is evacuated by the collimator 16 cooled to several Kelvin. As a result, the processing chamber 11a can be more quickly evacuated.

The distance between the collimator 16 and the attaching surface 21a of the upper wall 21 is shorter than the distance between the collimator 16 and the placing surface 13a of the stage 13. In the case where the sputtering device 1 performs magnetron sputtering, the plasma P is generated near the upper wall 21. The collimator 16 absorbs the gas in the processing chamber 11a at a position closer to the upper wall 21. With the absorption, taking in of impurities into the plasma P is suppressed. Therefore, impurities contained in the film of the particles C deposited on the semiconductor wafer 2 are reduced, and the specific resistance of the film of the particles C formed on the surface of the semiconductor wafer 2 is reduced.

The temperature adjusting device 19 changes the temperature of the collimator 16 of the sputtering device 1 to adjust the temperature of the collimator 16. As a result, an influence on the result of the sputtering can be controlled by the temperature of the collimator 16 and the state of the inside of the processing chamber 11a where the collimator 16 is arranged, for example.

When the wall 35 is divided into two parts in the direction along the Z axis, the density of the first flow path 43 in the part close to the upper end portion 35a of the wall 35 is higher than the density of the first flow path 43 in the part close to the lower end portion 35b of the wall 35. Since the upper half of the wall 35 is closer to the plasma P than the lower half, the upper half is easily heated. A larger volume of the first flow path 43 is provided in the upper half of the wall 35, whereby the temperature of the collimator 16 can be easily adjusted.

Hereinafter, a second embodiment, will be described with reference to FIG. 6. Note that, in the description of a plurality of embodiments below, a configuration element having a similar function to the already described configuration element is denoted with the same reference signs as the already described configuration element, and description may be omitted. In addition, a plurality of configuration elements denoted with the same reference sign does not necessarily share all the functions and characteristics, and may have different functions and characteristics according to the embodiments.

Figure 6:
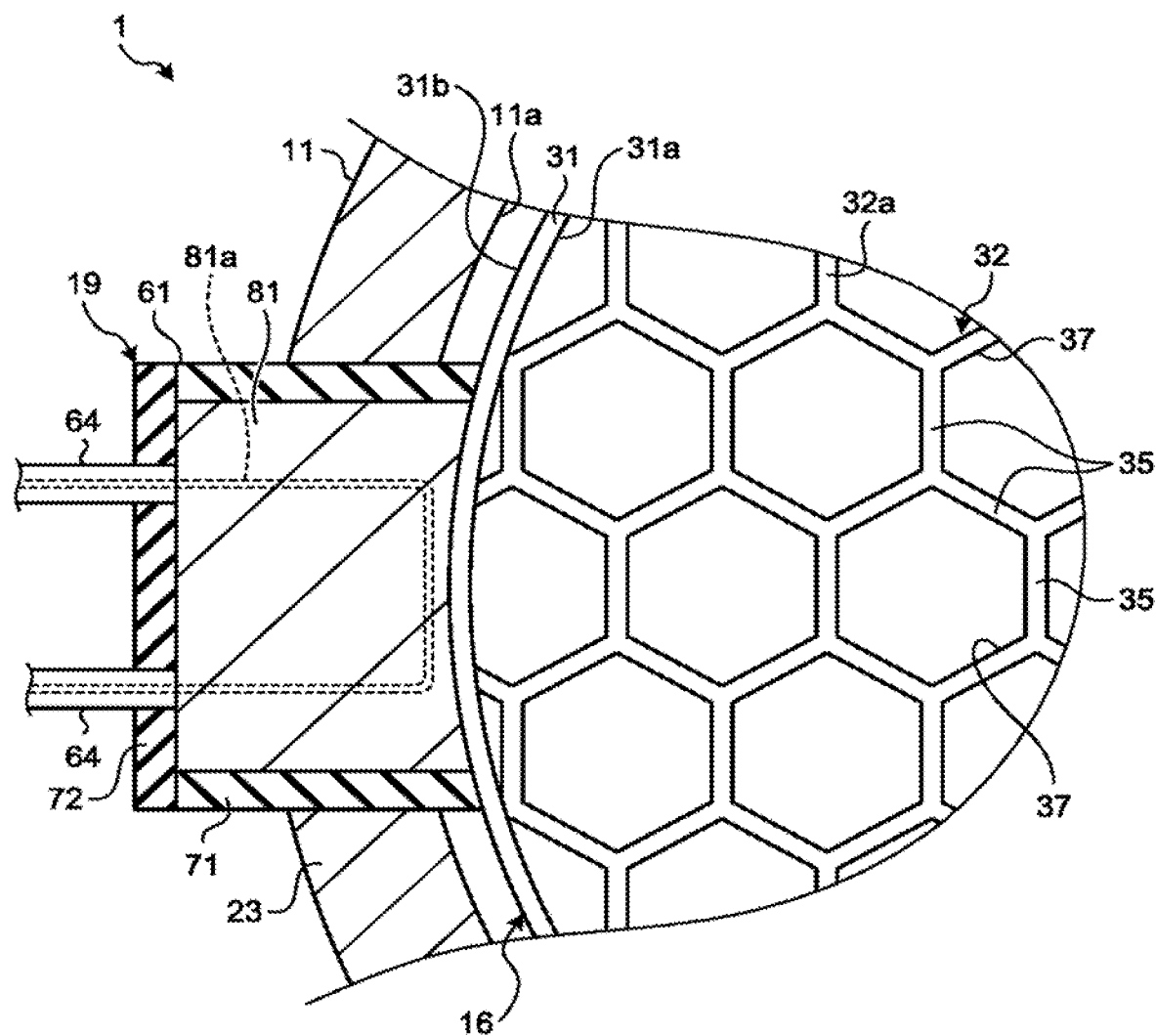
FIG. 6 is a cross-sectional view illustrating a part of a sputtering device according to a second embodiment.
Figure 6:
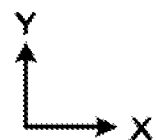

FIG. 6 is a cross-sectional view illustrating a part of a sputtering device 1 according to the second embodiment. Aa illustrated in FIG. 6, a first connecting device 61 of the second embodiment includes a contact portion 81 in place of the first connecting portion 73, the second connecting portion 74, and the fixing portion 75. The contact portion 81 is an example of a third connecting portion, and can be referred to as a heat conducting portion, for example.

The contact portion 81 comes in contact with an outer peripheral surface 31b of a frame 31 of a collimator 16. In other words, the contact portion 81 is thermally connected with the outer peripheral surface 31b of the frame 31. The contact portion 81 may be thermally connected with the collimator 16 via grease, paste, or a heat transfer sheet, for example.

A folded flow path 81a is provided inside the contact portion 81. The folded flow path 81a connects one end portion of one of first pipes 64 and one end portion of the other of the first pipes 64. A heat medium sent from a first freezing device 63 to one of the first pipes 64 passes through the folded flow path 81*a* and is returned to the first freezing device 63 through the other of the first pipes 64.

As the heat medium passes through the folded flow path 81*a*, the temperature of the contact portion 81 is decreased. Further, due to heat conduction, the temperature of the collimator 16 in contact with the contact portion 81 is also decreased. In this manner, the first freezing device 63 decreases the temperature of the collimator 16 through the contact portion 81.

In the sputtering device 1 of the second embodiment, the temperature adjusting device 19 decreases the temperature of the collimator 16 through the contact portion 81 thermally connected with the collimator 16. In other words, the temperature adjusting device 19 cools the collimator 16 by heat conduction. With the configuration, the collimator 16 can be cooled without providing the first flow path 43 inside the collimator 16. Leakage of the heat medium from the collimator 16 is suppressed and an increase in the thickness of the wall 35 due to the first flow path 43 is suppressed.

Figure 7:
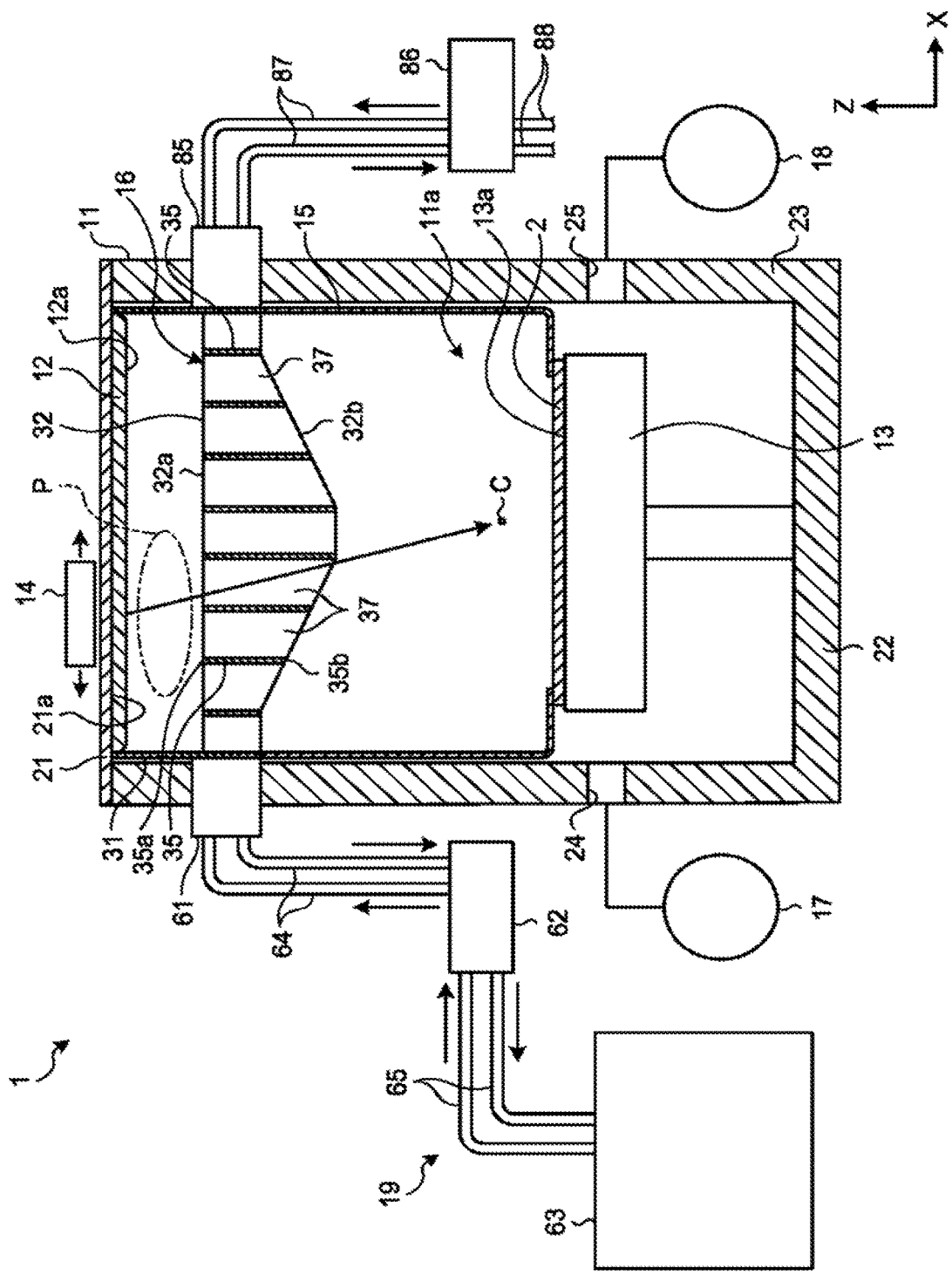
FIG. 7 is a cross-sectional view schematically illustrating a sputtering device according to a third embodiment.

Hereinafter, a third embodiment will be described with reference to FIGS. 7 and 8. FIG. 7 is a cross-sectional view schematically illustrating a sputtering device 1 according to the third embodiment. As illustrated in FIG. 7, a temperature adjusting device 19 of the third embodiment includes a second connecting device 85, a second freezing device 86, two third pipes 87, and two fourth pipes 88.

Figure 8:
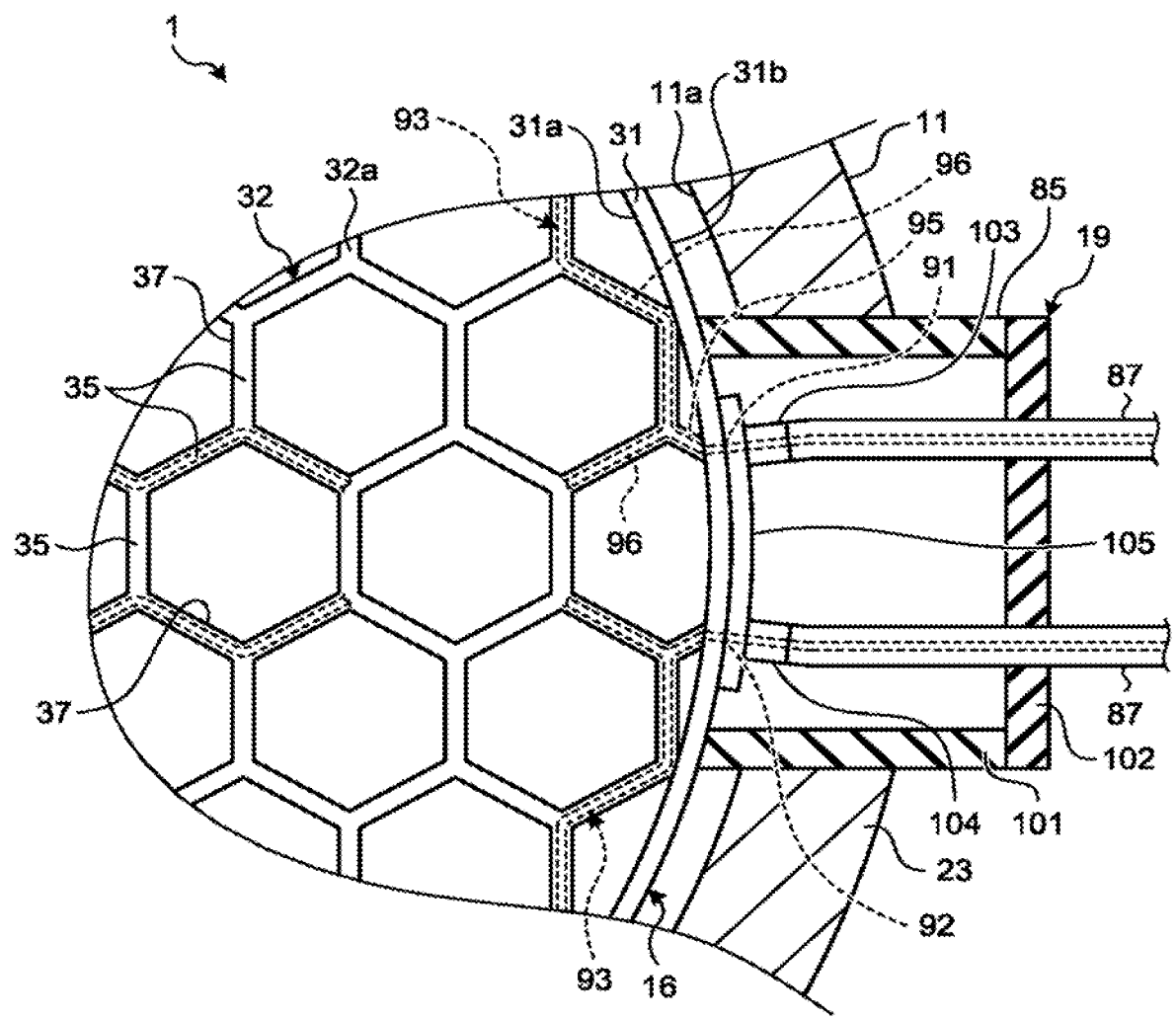
FIG. 8 is a cross-sectional view illustrating a part of the sputtering device of the third embodiment.
Figure 8:
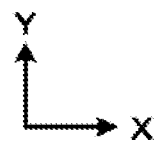

FIG. 8 is a cross-sectional view illustrating a part of the sputtering device 1 of the third embodiment. As illustrated in FIG. 8, a collimator 16 is provided with a third opening 91, a fourth opening 92, and a second flow path 93. The third and fourth openings 91 and 92 may also be referred to as, for example, connecting portions or end portions. The second flow path 93 may also be referred to as, for example, a pipe portion or a pipe.

The third opening 91 and the fourth opening 92 are provided on an outer peripheral surface 31*b* of a frame 31. The third opening 91 and the fourth opening 92 are arranged, at different positions from each other in the X-Y plane. However, the third opening 91 and the fourth opening 92 may be arranged at approximately the same position. The third opening 91, and the fourth opening 92 are arranged at different positions from each other in a direction along a Z axis. However, the third opening 91 and the fourth opening 92 may be arranged at approximately the same position.

The second flow path 93 is a hole that passes through an inside of a plurality of walls 35. The second flow path 93 connects the third opening 91 and the fourth opening 92. In other words, the third opening 91 is one end portion of the second flow path 93, and the fourth opening 92 is the other end portion of the second flow path 93.

The second flow path 93 is provided in insides of all the walls 35. In other words, the second flow path 93 is provided insides the plurality of walls 35 to pass through all the walls 35. A flow rectifying portion 32 may include a wall 35 in which no second flow path 93 is provided. Further, the second flow path 93 may be provided inside a frame 31. In FIG. 8, a part of the second flow path 93 is omitted. That is, the second flow path 93 is also provided inside the wall 35 where the second flow path 93 is not illustrated.

The flow rectifying portion 32 is provided with the first flow path 43 and the second flow path 93. As described above, the first flow path 43 and the second flow path 93 are provided inside the plurality of walls 35 to pass through all the walls 35. That is, the first flow path 43 and the second flow path 93 are provided in one wall 35. Note that, for example, the first flow path 43 may pass through half of the plurality of walls 35, and the second flow path 93 may pass through the other half of the plurality of walls 35.

The second flow path 93 is branched inside the flow rectifying portion 32. In other words, the second flow path 93 includes a third portion 95 and a plurality of fourth portions 96. The third portion 95 is closer to the third opening 91 than the fourth portions 96 in the path of the second flow path 93. The plurality of fourth portions 96 is connected to the third portion 95. The fourth portions 96 are closer to the fourth opening 92 than the third portion 95 in the path of the second flow path 93. In FIG. 8, a part of one fourth portion 96 is omitted. Note that the second flow path 93 may be provided as a unicursal path without being branched.

In the path of the second flow path 93, the second flow path 93 is branched on the way from the third opening 91 to the fourth opening 92. The branched second flow paths 93 are put together on the way from the third opening 91 toward the fourth opening 92.

The second connecting device 85 is provided in a chamber 11. The second connecting device 85 includes a cover 101, a lid 102, a third connecting portion 103, a fourth connecting portion 104, and a fixing portion 105.

The cover 101 is provided to a side wall 23. The cover 101 connects an inside of the chamber 11 and an outside of the chamber 11. The lid 102 is attached to the cover 101, thereby to airtightly close a processing chamber 11*a*. Two third pipes 87 penetrate the lid 102.

The third connecting portion 103 is connected to one end portion of one of the third pipes 87. The fourth connecting portion 104 is connected to one end portion of the other of the third pipes 87. As illustrated in FIG. 7, the other end portions of the two third pipes 87 are connected to the second freezing device 86.

As illustrated in FIG. 8, the fixing portion 105 is connected to the third connecting portion 103 and the fourth connecting portion 104. The fixing portion 105 is attached to an outer peripheral surface 31*b* of a frame 31 of the collimator 16. When the fixing portion 105 is attached to the frame 31, the third connecting portion 103 is connected to the third opening 91, and the fourth connecting portion 104 is connected to the fourth opening 92.

The third connecting portion 103 and one of the third pipes 87 connect the third opening 91 and the second freezing device 86. The fourth connecting portion 104 and the other of the third pipes 87 connect the fourth opening 92 and the second freezing device 86.

The cover 101, the lid 102, the third connecting portion 103, the fourth connecting portion 104, and the fixing portion 105 have insulating properties. For example, the cover 101, the lid 102, the third connecting portion 103, the fourth connecting portion 104, and the fixing portion 105 are made of an insulating material such as a synthetic resin or a ceramic. Note that a part of the second connecting device 85 may have conductivity.

As described above, the second connecting device 85 connects the third and fourth openings 91 and 92 and the second freezing device 86 via the two third pipes 87. The specific configuration of the second connecting device 85 is not limited to the above-described configuration.

The second freezing device 86 illustrated in FIG. 7 sends a heat medium compressed and cooled by a cylinder to one of the third pipes 87. Further, the second freezing device 86 compresses and cools again the heat medium returned from the other of the third pipes 87 with the cylinder. In this manner, one of the third pipes 87 is a supply-side pipe. The other of the third pipes 87 is a return-side pipe.

The second freezing device 86 causes the heat medium to flow into the third pipes 87 from one of the third pipes 87 and the third connecting portion 103. The heat medium flows from the third opening 91 into the second flow path 93.

The heat medium flows in the second flow path 93 from the third opening 91 toward the fourth opening 92. As the heating medium flows through the second flow path 93, the temperature of the wall 35 provided with the second flow path 93 decreases. The temperature of the wall 35 without the second flow path 93 also decreases due to heat conduction. In this manner, the temperature adjusting device 19 decreases the temperature of the collimator 16. In other words, the temperature adjusting device 19 is configured to change the temperature of the collimator 16 to adjust the temperature of the collimator 16.

The heat medium flows through the fourth opening 92 to the fourth connecting portion 104. The heat medium passes through the fourth connecting portion 104 and the other of the third pipes 87 through the fourth opening 92, and is returned to the second freezing device 86. The second freezing device 86 cools again the heat medium flowing out through the fourth opening 92 and sends the heat medium to the third opening 91.

Two fourth pipes 88 connect the second freezing device 86 and a compressor 63. In FIG. 7, a part of the fourth pipes 88 is omitted. One of the fourth pipes 88 is a supply (high pressure)-side pipe. The other of the fourth pipes 88 is a return (low pressure)-side pipe.

In the above-described sputtering device 1, the first freezing device 62 causes the heat medium to flow in the first flow path 43 to decrease the temperature of the collimator 16. Further, the second freezing device 86 causes the heat medium to flow in the second flow path 93 to decrease the temperature of the collimator 16. That is, the plurality of freezing devices 62 and 86 cause the heat medium to flow in the plurality of flow paths 45 and 93 of the collimator 16, thereby to change the temperature of the collimator 16 to adjust the temperature of the collimator 16.

In the sputtering device 1 of the third embodiment, the temperature adjusting device 19 cools the heat medium flowing out through the fourth opening 92 of the collimator 16, and causes the heat medium to flow into the second flow path 93 of the collimator 16 through the third opening 91. In this way, the collimator 16 is cooled by the heat medium passing through the first flow path 43 and the heat medium passing through the second flow path 93. With the configuration, the collimator 16 having a large surface area can be more easily cooled to several Kelvin. Further, since the collimator 16 is cooled by the heat medium flowing tin rough the two flow paths 43 and 93, occurrence of uneven temperature in the collimator 16 is suppressed.

In the third embodiment, the heat medium flows through the plurality of flow paths 43 and 93, whereby the collimator 16 is cooled. However, the second connecting device 85 may include the contact portion 81 of the second embodiment. In other words, the temperature adjusting device 19 may decrease the temperature of the collimator 16 by causing the heat medium to flow in the first flow path 43 and by thermal conduction. Further, each of the first connecting device 61 and the second connecting device 85 may include the contact portion 81.

In at least one of the embodiments described above, the sputtering device 1 is an example of a processing device. However, the processing device may be another device such as a vapor deposition device.

In the case where the processing device is a vapor deposition device, for example, the material to be evaporated is an example of a particle generation source, the vapor generated from the material is an example of particles, and a processing object to be vaporized is an example of an object. Vapor, which is a vaporized substance, contains one or a plurality of kinds of molecules. The molecules are particles. In the vapor deposition device, the collimator 16 is arranged between a position where the material to be evaporated is arranged and a position where the processing object is arranged.

According to at least one of the embodiments described above, the temperature adjusting unit can control the processing result by adjusting the temperature of the collimator.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A film forming device comprising:
   an object placement unit configured to have an object placed thereon;
   a source placement unit arranged apart from the object placement unit and configured to have a particle source placed thereon, the particle source being capable of ejecting a particle toward the object;
   a cryopump including a collimator and a temperature adjusting unit,
      the collimator configured to be arranged between the object placement unit and the source placement unit, including a plurality of walls, and provided with a plurality of through holes formed by the plurality of walls and extending a direction from the object placement unit to the source placement unit, and
      the temperature adjusting unit configured to decrease a temperature of the collimator to a temperature at which air is attached to surfaces of the walls; and
   a container including an airtightly closable processing chamber, wherein
   the object placement unit, the source placement unit, and the collimator are configured to be arranged in the processing chamber,
   and
   the cryopump is configured to cause the air in the processing chamber to be attached to the surfaces of the walls to make the processing chamber vacuum.

2. The film forming device according to claim 1, wherein the collimator is provided with a first opening, a second opening, and a first flow path passing through inside of the plurality of walls and connecting the first opening and the second opening, and
   the temperature adjusting unit is configured to cause a heat medium to flow into the first flow path through the first opening, and to cool the heat medium flowing out through the second opening.

3. The film forming device according to claim 2, wherein the first flow path includes a first portion, and a plurality of second portions closer to the second opening than the first portion in a path of the first flow path is to the second opening and connected to the first portion.

4. The film forming device according to claim 2, wherein
the temperature adjusting unit includes a first connecting portion configured to be connected to the first opening and a second connecting portion configured to be connected to the second opening, and is configured to cause the heat medium to flow into the first opening from the first connecting portion, and to cool the heat medium flowing out to the second connecting portion through the second opening,
the first connecting portion has an insulating property, and
the second connecting portion has an insulating property.

5. The film forming device according to claim 2, wherein
the collimator is provided with a third opening, a fourth opening, and a second flow path passing through inside of the plurality of walls and connecting the third opening and the fourth opening, and
the temperature adjusting unit is configured to cause the heat medium to flow into the second flow path through the third opening, and to cool the heat medium flowing out through the fourth opening.

6. The film forming device according to claim 1, wherein
the temperature adjusting unit includes a third connecting portion configured to be thermally connected with the collimator, and is configured to decrease the temperature of the collimator through the third connecting portion.

7. The film forming device according to claim 1, further comprising a pump configured to suck the air in the processing chamber.

8. The film forming device according to claim wherein
a distance between the collimator and the source placement unit is shorter than a distance between the collimator and the object placement unit.

9. A sputtering device comprising the film forming device of claim 1.

10. The film forming device according to claim 2, wherein
the first flow path includes a linear portion and a curved portion, the linear portion and the curved portion provided inside one of the walls,
the linear portion extends in a linear direction from the one of the walls to another of the walls, and
the curved portion extends in a direction intersecting with the linear direction.

11. The film forming device according to claim 2, wherein
the first flow path includes a supply portion and a return portion, the supply portion and the return portion provided inside one of the walls and separated from each other in the one of the walls, the supply portion being closer to the first opening than to the second opening in the path of the first flow path, and the return portion being closer to the second opening than to the first opening in the path of the first flow path.

12. The film forming device according to claim 2, wherein
the walls each includes a first part and a second part, the first part closer to the source placement unit than the second part is to the source placement unit, and the second part closer to the object placement unit than the first part is to the object placement unit, and
the density of the first flow path in the first part is higher than the density of the first flow path in the second part.

13. A cryopump comprising:
a collimator to control a direction of a particle to be deposited on an object, the collimator including:
a frame provided with a first opening and a second opening; and
a plurality of walls, at least a part of the walls being positioned inside the frame, the walls forming a plurality of through holes and provided with a first flow path passing through inside of the walls and connecting the first opening and the second opening; and
a temperature adjusting unit configured to decrease a temperature of the walls to a temperature at which air is attached to surfaces of the walls.

14. The cryopump according to claim 13, wherein
the first flow path includes a first portion, and a plurality of second portions closer to the second opening than the first portion in a path of the first flow path is to the second opening and connected to the first portion.

15. The cryopump according to claim 13, wherein
the frame is provided with a third opening and a fourth opening, and
the plurality of walls is provided with a second flow path passing through inside of the plurality of walls and connecting the third opening and the fourth opening.

* * * * *